(12) United States Patent
Hirabayashi et al.

(10) Patent No.: US 12,342,573 B2
(45) Date of Patent: Jun. 24, 2025

(54) SEMICONDUCTOR DEVICE

(71) Applicant: RENESAS ELECTRONICS CORPORATION, Tokyo (JP)

(72) Inventors: Seiji Hirabayashi, Tokyo (JP); Yusuke Ojima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 437 days.

(21) Appl. No.: 18/065,091

(22) Filed: Dec. 13, 2022

(65) Prior Publication Data
US 2023/0290879 A1  Sep. 14, 2023

(30) Foreign Application Priority Data
Mar. 9, 2022 (JP) ................................. 2022-036163

(51) Int. Cl.
*H10D 30/66* (2025.01)
*H01L 25/07* (2006.01)
*H10D 64/00* (2025.01)

(52) U.S. Cl.
CPC ......... *H10D 30/669* (2025.01); *H01L 25/074* (2013.01); *H10D 30/668* (2025.01); *H10D 64/117* (2025.01)

(58) Field of Classification Search
CPC ..... H10D 84/83; H10D 64/117; H10D 30/669
See application file for complete search history.

(56) References Cited

U.S. PATENT DOCUMENTS

| | | | | |
|---|---|---|---|---|
| 2009/0189219 A1* | 7/2009 | Shinbori | ............... | H10D 30/668 |
| | | | | 257/334 |
| 2015/0035080 A1* | 2/2015 | Matsumoto | ............ | H10D 84/83 |
| | | | | 257/390 |
| 2015/0076590 A1* | 3/2015 | Meiser | ................... | H10D 84/83 |
| | | | | 438/270 |
| 2015/0084135 A1* | 3/2015 | Miura | ..................... | H01L 24/05 |
| | | | | 257/401 |
| 2017/0194486 A1* | 7/2017 | Venkatraman | ....... | H10D 62/393 |
| 2020/0035819 A1* | 1/2020 | Naito | ................... | H10D 64/518 |
| 2021/0344341 A1* | 11/2021 | Okuda | ................. | H10D 30/669 |
| 2021/0367071 A1* | 11/2021 | Shinoda | ............... | H10D 30/668 |
| 2023/0290879 A1* | 9/2023 | Hirabayashi | ......... | H10D 30/668 |
| 2023/0326922 A1* | 10/2023 | Shimoyama | ......... | H10D 64/513 |
| 2024/0153944 A1* | 5/2024 | Osumi | .................. | H10D 84/00 |
| 2024/0213245 A1* | 6/2024 | Fukuda | ............... | H10D 84/038 |
| 2024/0282846 A1* | 8/2024 | Umeki | ................. | H10D 30/021 |
| 2025/0022796 A1* | 1/2025 | Mori | .................... | H10D 12/481 |

FOREIGN PATENT DOCUMENTS

JP  2011-199109 A  10/2011

* cited by examiner

*Primary Examiner* — Vincent Wall
(74) *Attorney, Agent, or Firm* — Rimon P.C.

(57) ABSTRACT

A performance of a semiconductor device including a main MOSFET and a sensing MOSFET having a double-gate structure including a gate electrode and a field plate electrode inside a trench is improved. A main MOSFET including a gate electrode and a field plate electrode inside a second trench and a sensing MOSFET for electric-current detection including a gate electrode and a field plate electrode inside a fourth trench are surrounded by different termination rings, respectively.

8 Claims, 11 Drawing Sheets

1SM  1MM

SEMICONDUCTOR DEVICE

CROSS-REFERENCE TO RELATED APPLICATION

The disclosure of Japanese Patent Application No. 2022-036163 filed on Mar. 9, 2022, including the specification, drawings and abstract is incorporated herein by reference in its entirety.

BACKGROUND

The present invention relates to a semiconductor device, and relates to a technique effectively applied to, for example, a semiconductor device including a main MOSFET and a small-scaled MOSFET for electric-current detection.

There is a disclosed technique listed below.
[Patent Document 1] Japanese Unexamined Patent Application Publication No. 2011-199109

For a power MOSFET requiring a high breakdown voltage, an ability to accurately monitor an electric current value flowing in an element may be needed for a purpose of monitor, control or others of an internal state. As a structure for measuring an electric current value of a main MOSFET mounted on a semiconductor chip, mounting a small-scaled sensing MOSFET for the electric-current detection on the semiconductor chip is known.

As the power MOSFET structure, the Patent Document 1 (Japanese Unexamined Patent Application Publication No. 2011-199109) describes a double-gate structure including a gate electrode and a field plate electrode embedded inside a trench.

SUMMARY

A sensing MOSFET includes a different source pad from that of the main MOSFET, and the same potential is normally applied to these source pads. However, a timing of the application of the potential may be even instantly different between these source pads, and therefore, it is necessary to secure a breakdown voltage between a source of the main MOSFET and a source of the sensing MOSFET.

When a trench is formed between the main MOSFET having the double-gate structure and the sensing MOSFET in order to secure the breakdown voltage, a case of increase of a chip size due to complexity of wiring and occurrence of an unavailable region of an element is conceivable. Therefore, a contrivance to secure the breakdown voltage between the elements and to prevent the increase of the chip size is necessary.

Other objects and novel characteristics will be apparent from the description of the present specification and the accompanying drawings.

The outline of the typical aspects of the embodiments disclosed in the present application will be briefly described as follows.

In a semiconductor device according to an embodiment, a main MOSFET including a gate electrode and a field plate electrode inside a trench and a sensing MOSFET for electric-current detection including a gate electrode and a field plate electrode inside a trench are surrounded by different termination rings, respectively.

According to an embodiment, a performance of a semiconductor device can be improved.

BRIEF DESCRIPTIONS OF THE DRAWINGS

DETAILED DESCRIPTION

Figure 1:
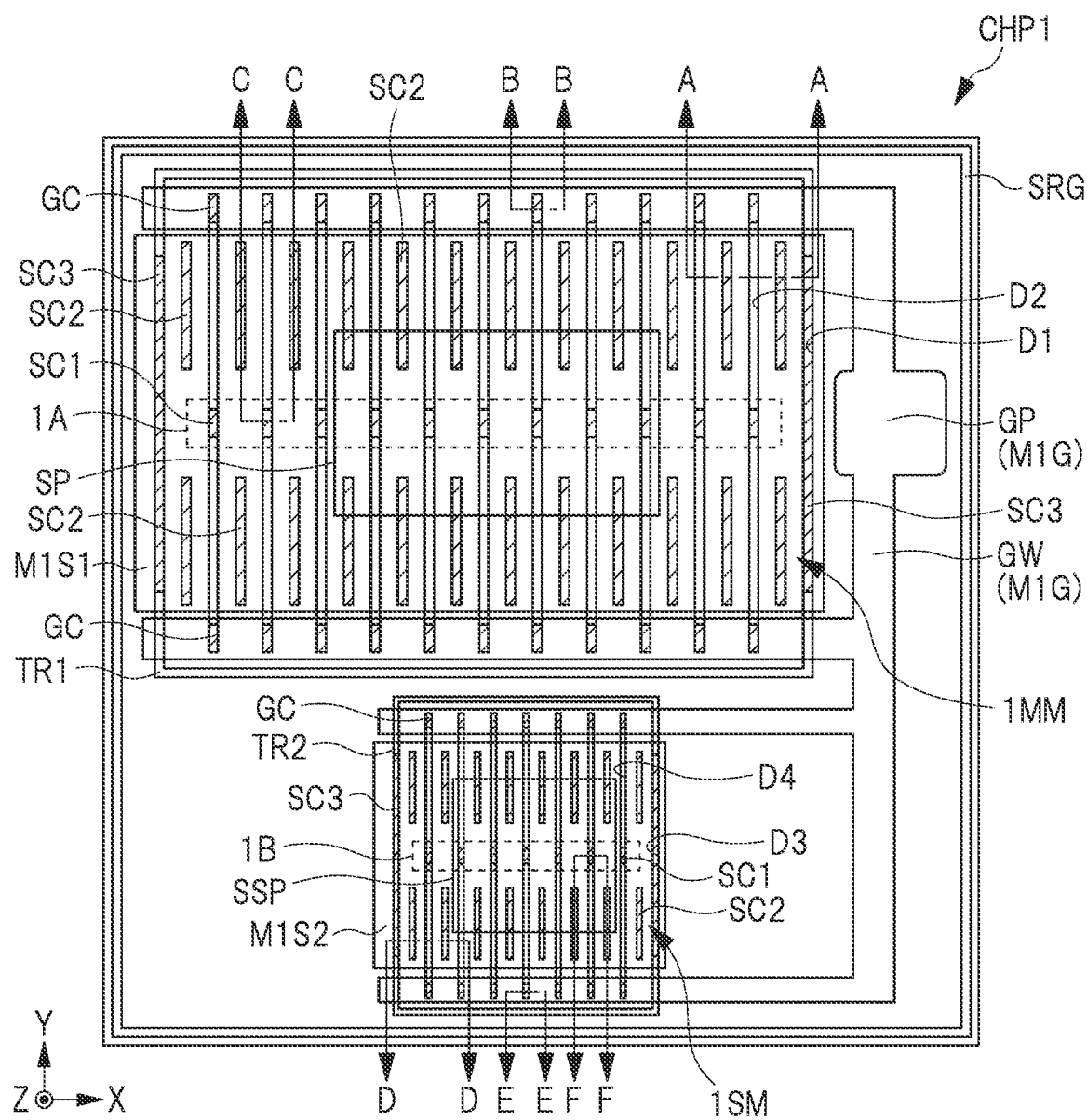
FIG. 1 is a planar layout showing a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate or similar shapes and the like are included therein unless otherwise stated or except the case where it is conceivable that they are apparently excluded in principle. The same goes for the numerical value and the range described above.

Hereinafter, the embodiments will be described in detail with reference to the accompanying drawings. Note that components having the same function are denoted by the same reference signs throughout the drawings for describing the embodiments, and the repetitive description will be omitted. In the embodiments described below, the explanation for the same or similar portions will not be repeated in principle unless otherwise required.

A term "width" described in the present application means a length of an object (pattern) in a direction (horizontal direction, lateral direction) along an upper surface of a semiconductor substrate. A term "thickness" described in the present application means a length of the object in a direction (thickness direction, height direction, up-and-down direction, vertical direction) perpendicular to the upper surface of the semiconductor substrate. In each plan view (planar layout) used in the following explanation, hatching is added to a contact plug for easily understanding the drawings.

A power MOSFET will be exemplified and explained here as the semiconductor device of the present application. The power MOSFET is a semiconductor device capable of handling a power of several watts or larger. The semiconductor device of the present application includes a trench gate power MOSFET of the power MOSFET. The trench gate power MOSFET includes a gate electrode made of polysilicon or others inside a trench (that is a relatively long and thin groove) formed in an upper surface (first main surface) of a semiconductor substrate, and includes a channel formed in the thickness direction of the semiconductor substrate. In this case, regularly, an upper surface side of the semiconductor substrate becomes a source and a lower surface (back surface, second main surface) side of the semiconductor substrate becomes a drain.

The semiconductor device of the present application includes an intra-trench double-gate power MOSFET of the trench gate power MOSFET. The intra-trench double-gate power MOSFET includes a field plate electrode below a gate electrode (intrinsic gate electrode) inside a trench. The field plate electrode is an electrode having a function of dispersing a sharp potential gradient concentrating on a vicinity of an end of the gate electrode, the end being close to the drain, and is electrically connected to a source electrode.

<Details of Room for Improvement>

Details of a room for improvement will be explained below with reference to drawings.

The sensing MOSFET (Metal Oxide Semiconductor Field Effect Transistor) for electric-current detection is a MOSFET arranged in parallel to a main MOSFET mainly configuring the power MOSFET, and including a drain and a gate shared between itself and the main MOSFET. Heat generation can be monitored in combination with an IC (Integrated Circuit), based on the electric-current detection using a ratio (sense ratio) of electric current flowing in the main MOSFET and the sensing MOSFET.

It is conceivable that the same potential is applied to each source pad of the main MOSFET and the sensing MOSFET. In this case, if a pin connected to the source pad of the main MOSFET and a pin connected to the source pad of the sensing MOSFET are independent from each other, timing of the application of the potential to these source pads is possibly even instantly different therebetween. Therefore, it is necessary to secure a breakdown voltage of, for example, about 5 V between the source of the main MOSFET and the source of the sensing MOSFET.

As a method for electrical insulation between the main MOSFET and the sensing MOSFET, a method for insulating them by doping in formation of an n$^+$-type diffusion region and a method for insulating a p-type body layer (p-type well) by a trench formed in an upper surface of a semiconductor substrate are conceivable.

In this case, in the intra-trench double-gate power MOSFET, the field plate electrode is formed below the gate electrode inside the trench. The intra-trench double-gate power MOSFET includes the field plate electrode to which the source potential is applied, inside the trench, and therefore, a parasitic capacity of the MOSFET can be suppressed, and a switching speed of the MOSFET can be increased.

However, in the intra-trench double-gate power MOSFET, insulation between the main MOSFET and the sensing MOSFET only by separate doping in the formation of the n$^+$-type diffusion region decreases a threshold voltage Vth, and causes punch-through phenomenon. In other words, there is a first room for improvement that is securement of the breakdown voltage. Accordingly, as a method for insulating the main MOSFET and the sensing MOSFET in the intra-trench double-gate power MOSFET, a method of forming a trench D5 to insulate these MOSFETs as shown in comparative examples of FIGS. 13 and 14 is conceivable.

Figure 13:
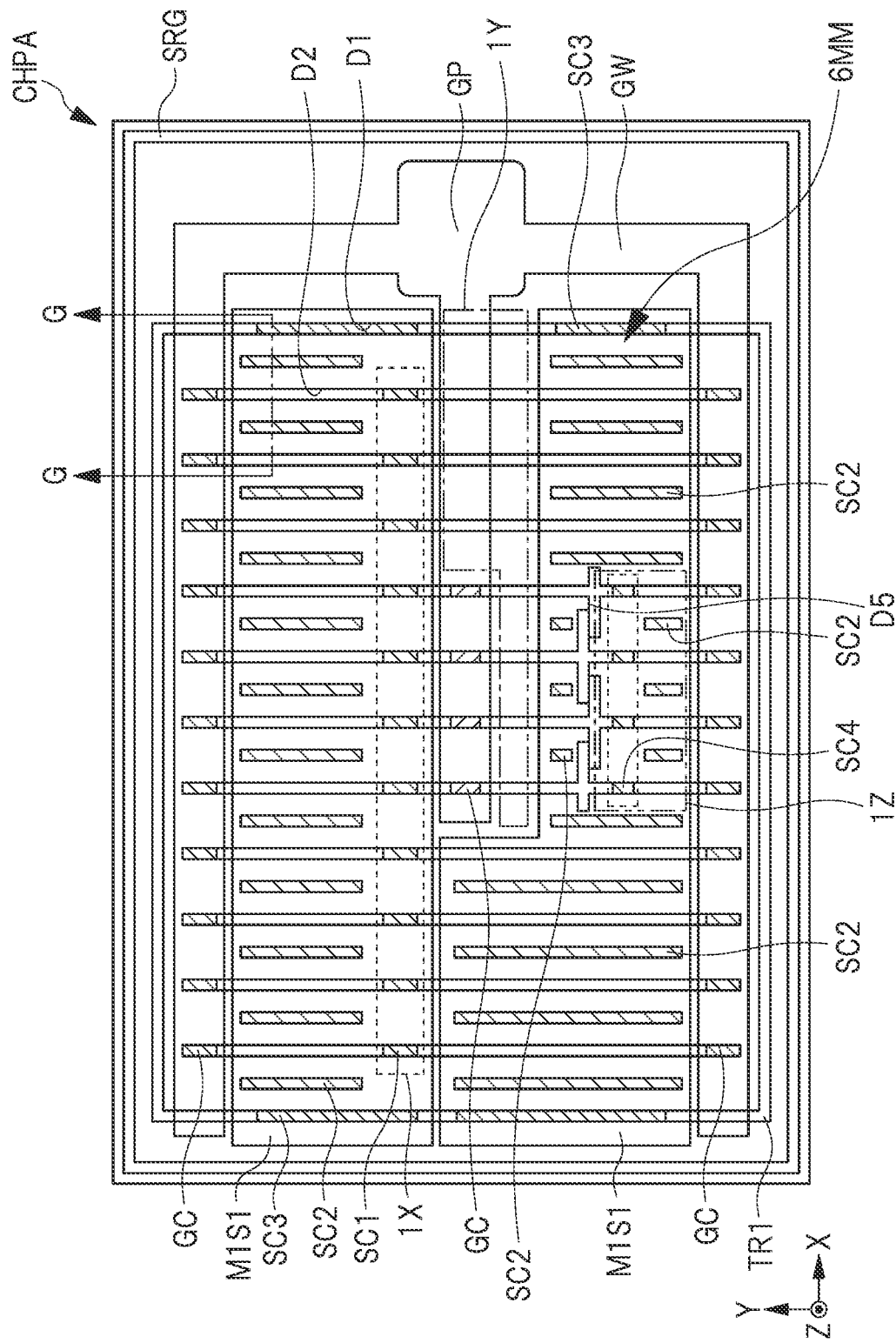
FIG. 13 is a planar layout showing a semiconductor device according to a comparative example.

FIG. 13 shows a planar layout of a semiconductor chip CHPA including the intra-trench double-gate power MOSFET that is a semiconductor device (semiconductor chip) of a comparative example. The semiconductor device shown in FIG. 13 includes the main MOSFET 6MM occupying most of an area of the semiconductor chip in plan view and the sensing MOSFET used for electric-current detection. The sensing MOSFET is formed in a region 1Z surrounded by a dashed double-dotted line in FIG. 13. The sensing MOSFET is smaller than the main MOSFET 6MM, an area occupancy of the sensing MOSFET in plan view of the semiconductor chip is smaller than an area occupancy of the main MOSFET 6MM. In FIG. 13, a structure below a wiring formed on an upper surface of a semiconductor substrate is illustrated in a perspective view, and illustration of insulating films such as an interlayer insulating film and a passivation film on the semiconductor substrate is omitted.

Figure 14:
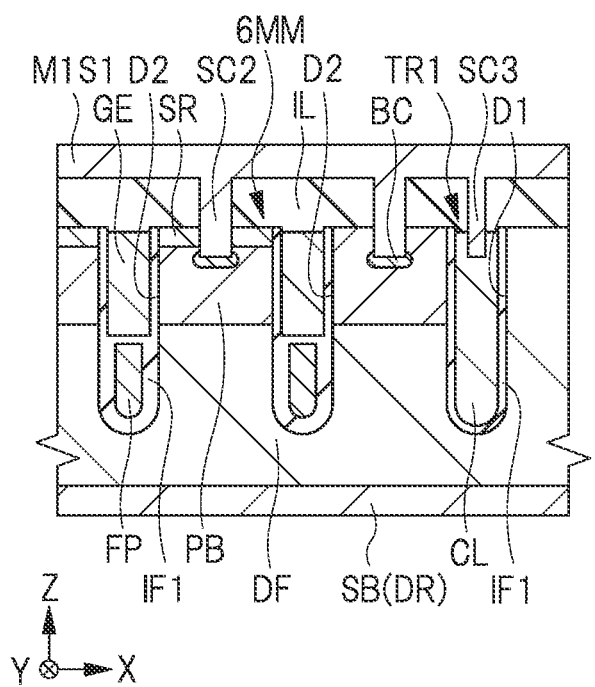
FIG. 14 is a cross-sectional view on a line G-G of FIG. 13.

FIG. 14 shows a cross-sectional view on a line G-G of FIG. 13. As shown in FIG. 14, the semiconductor device of the comparative example includes a substrate SB and a drift layer DF that is a semiconductor layer formed on the substrate SB. Inside a trench D1 formed in the upper surface of the substrate, a conductive film CL is buried to interpose an insulating film IF1 therebetween. Inside a trench D2 formed in the upper surface of the semiconductor substrate, a gate electrode GE and a field plat electrode FP below the gate electrode GE are buried to interpose the insulating film IF1 therebetween. A source region SR is formed in the upper surface of the semiconductor substrate between the adjacent trenches D2. In order to apply the source potential to the source region SR and to a p-type body layer below the source region SR, a contact plug SC2 is formed on the semiconductor substrate. A p$^+$-type diffusion region BC that is a body contact region is formed in the upper surface of the semiconductor substrate below the contact plug SC2.

As shown in FIG. 13, the trench D2 extends in a Y direction along the upper surface of the semiconductor substrate, and a plurality of trenches D2 are aligned in an X direction along the upper surface of the semiconductor substrate. The trench D2 encloses the double gate structure including the gate electrode GE and the field plate electrode FP inside itself. However, the gate electrode GE is not formed inside the trench D2 of a region 1X surrounded by a dot line. In the region 1X, a contact plug (conductive connecting portion) SC1 for applying a source potential from a wiring M1S1 configuring the source pad to the field plate electrode FP is formed on the field plate electrode FP. And, a contact plug GC for applying a gate potential to the gate electrode GE is formed immediately below the gate wiring GW connected to the gate pad GP.

The sensing MOSFET and the main MOSFET 6MM are different in the area but the same in the structure. In the present comparative example, the source region SR and the body layer PB of each of the sensing MOSFET and the main MOSFET 6MM are electrically insulated from each other by the trench D5 extending in the X direction. Therefore, as shown in a center of FIG. 13, it is necessary to extend the gate wiring GW in the X direction and arrange the conduct plug GC below it. In the region surrounded by the dot line in the region of FIG. 13 where the sensing MOSFET is formed, it is necessary to form a contact plug SC4 for connecting the wiring M1S1, the source region SR and the body layer PB. In other words, regions for formations of the contact plug and the wiring for the fixation at the gate potential and the source potential are necessary, and therefore, there is a second room for improvement that is the increase of the chip area.

Also, due to the arrangement of the gate wiring GW or others, the $p^+$-type diffusion region BC is not allowed to be formed in a region 1Y illustrated with a dashed dotted line in FIG. 13. This is because the $p^+$-type diffusion region BC is formed by formation of an opening used for forming the contact plug SC1 in an interlayer insulating film IL (see FIG. 14) on the semiconductor substrate, and then, ion doping on a base surface of this opening in the semiconductor substrate before forming the contact plug SC1. Therefore, the $p^+$-type diffusion region BC is not allowed to be formed in the region 1Y, and the MOSFET is not allowed to be formed, and thus, the region 1Y substantially becomes the unavailable region. This is also a cause of the increase of the chip area. In addition, since the $p^+$-type diffusion region BC is not allowed to be formed in the region 1Y, the threshold voltage Vth is decreased, and the punch-through phenomenon is easily caused.

As described above, the intra-trench double-gate power MOSFET including the sensing MOSFET in addition to the main MOSFET has the first room and the second room for improvement to be solved.

Accordingly, in the following embodiments, a contrivance to simultaneously solve the first room and the second room for improvement is performed. A technical idea with this contrivance in an embodiment will be explained below.

First Embodiment

<Structure of Semiconductor Device>

With reference to FIGS. 1 to 7, a semiconductor device of the present embodiment will be explained below.

Figure 2:
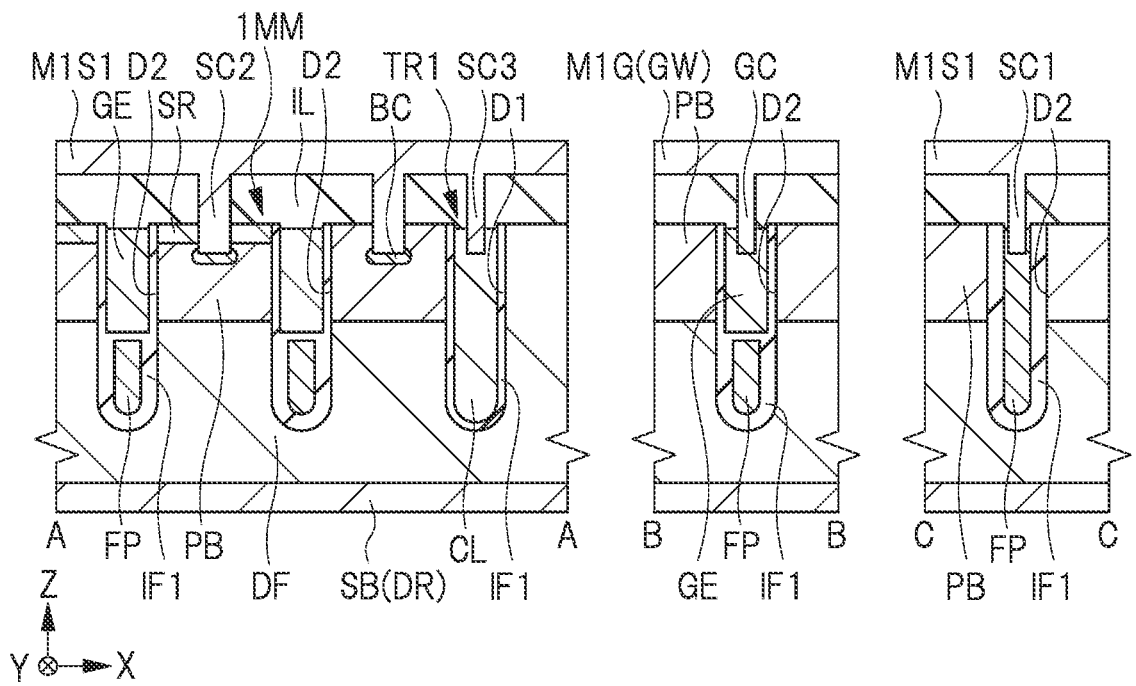
FIG. 2 is cross-sectional views on a line A-A, a line B-B and a line C-C of FIG. 1.
Figure 3:
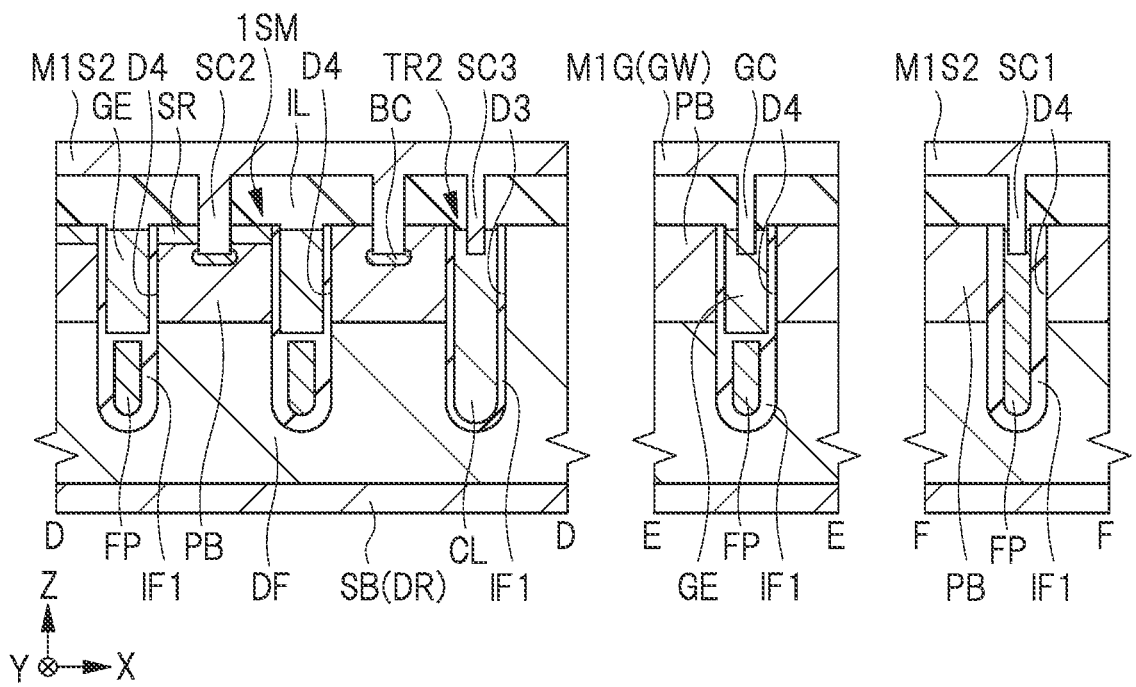
FIG. 3 is cross-sectional views on a line D-D, a line E-E and a line F-F of FIG. 1.
Figure 4:
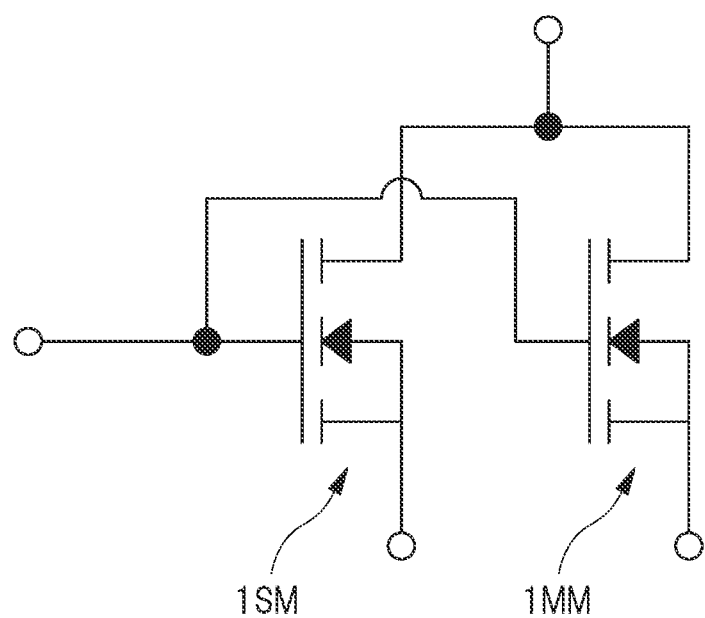
FIG. 4 is a circuit diagram showing the semiconductor device according to the first embodiment.

As shown in FIG. 1, the semiconductor device of the present embodiment is a semiconductor device CHP1 including the semiconductor substrate, and the semiconductor chip CHP1 includes a main MOSFET 1MM and a sensing MOSFET 1SM. FIG. 2 shows cross-sectional views on a line A-A, a line B-B and a line C-C of the main MOSFET 1MM of FIG. 1 in this order from left. FIG. 3 shows cross-sectional views on a line D-D, a line E-E and a line F-F of the sensing MOSFET of FIG. 1 in this order from left. The semiconductor substrate has an upper surface (first main surface) and a lower surface (second main surface) opposite to this upper surface. FIG. 1 shows a perspective view of a structure below a wiring formed on the upper surface of the semiconductor substrate, and illustration of insulating films such as the interlayer insulating film and the passivation film on the semiconductor substrate is omitted.

As shown in FIG. 2, the semiconductor substrate configuring the semiconductor device of the present embodiment includes, for example, a substrate SB made of single crystal Si (silicon) or others, and a drift layer DF that is a semiconductor layer formed on the substrate SB by an epitaxial growth method or others. The substrate SB configures an $n^+$-type drain region DR. Although not illustrated, a lower surface of the substrate SB is covered with a drain electrode containing, for example, Au (gold) or others, and the drain region DR is connected to the drain electrode.

The drift layer DF is an $n^-$-type semiconductor layer. In an active region where the main MOSFET 1MM is formed, a plurality of trenches D2 extending in the Y direction along the upper surface of the semiconductor substrate are aligned in the X direction along the upper surface of the semiconductor substrate. The Y direction and the X direction are directions that are orthogonal to each other in plan view. The Z direction that is orthogonal to each of the Y direction and the X direction is a height direction (thickness direction, perpendicular direction, vertical direction) perpendicular to the upper surface of the semiconductor substrate.

As shown in FIG. 1, in the upper surface of the semiconductor substrate, the trench D1 surrounding the active region where the main MOSFET 1MM is formed in plan view is formed. As shown in FIG. 2, a conductive film CL is buried inside the trench D1 so as to interpose an insulating film IF1 therebetween, and these trench D1, insulating film IF1 and conductive film CL configure a termination ring TR1. The active region where the maim MOSFET is formed is surrounded by an annular termination ring TR1 in plan view (see FIG. 1). On the upper surface of the semiconductor substrate in a circumferential portion of the semiconductor chip CHP1, a seal ring SRG having the same structure as that of the termination ring TR1 is formed. The seal ring SRG surrounds the main MOSFET 1MM, the sensing MOSFET 1SM and the termination rings TR1 and TR2 in plan view.

Inside the trench D2, a gate wiring GW and the field plate electrode FP below the gate wiring GW are buried to interpose the insulating film IF1 therebetween. Such a structure including two electrodes inside the trench is referred to as double-gate structure (double-gate type) here. In the active region, on the upper surface of the semiconductor substrate (the upper surface of the drift layer DF), the body layer PB that is the p-type semiconductor layer is formed in contact with a side surface of the trench D2. A depth of the body layer PB is shallower than a depth of, for example, the gate electrode GE.

In the active region, on the upper surface of the semiconductor substrate (the upper surface of the drift layer DF), the source region SR that is the $n^+$-type semiconductor layer (the $n^+$-type diffusion layer) is formed in contact with a side surface of the trench D2. A depth of the source region SR is shallower than both depths of the body layer PB and the gate electrode GE. A lower surface of the source region SR is in contact with the body layer PB, and a lower surface of the body layer PB is in contact with the drift layer DF.

The source region SR, the drain region DR, the body layer PB and the gate electrode GE configure the main MOSFET 1MM that is the vertical-type MOSFET. When the main MOSFET 1MM is in the ON state, a channel (inversion layer) is formed in the body layer PB adjacent to the trench D2 provided with the gate electrode DR, and the electric current flows from the drain region DR through the drift layer DF and the channel in the body layer PB to the source region SR.

The wiring M1S1 and the wiring M1G are formed on each of the semiconductor substrate, the gate electrode GE, the insulating film IF1 and the conductive film CL so as to interpose the interlayer insulating film IL therebetween. The interlayer insulating film IL is mainly made of, for example, silicon oxide. Each of the wiring M1S1 and the wiring M1G is made of, for example, Al (aluminium), and they are aligned to separate from each other. In the interlayer insulating film IL, a plurality of openings (through holes) are formed. Inside each of the openings, the contact plugs (conductive connecting portions) SC1, SC2 and SC3 unified with the wiring M1S1 or the contact plug GC unified with the wiring M1G is formed. In other words, in the active region, the contact plug SC2 penetrating the interlayer insulating film IL extends in the Y direction on the semiconductor substrate between the adjacent trenches D2. Immediately on the conductive film CL configuring the termination ring TR1, the contact plug (conductive connecting portion) GC unified with the wiring M1S1 is formed.

Although not illustrated, a part of the upper surface of each of the wiring M1S1 and the wiring M1G is covered with the passivation film. FIG. 1 shows the source pad SP made of a part of the upper surface of the wiring M1S1 in the rectangular opening of the passivation film. The gate pad GP made of a part of the upper surface of the wiring M1G is exposed out of the passivation film. Immediately on an end of the trench D2 in the Y direction, the gate wiring GW made of the wiring M1G extends continuously from a region of the gate pad GP, and the gate electrode GE shown in FIG. 2 is electrically connected to the gate wiring GW (the wiring M1G) through the contact plug GC. The conductive film CL configuring the termination ring TR1 is electrically connected to the wiring M1S1 through the contact plug SC1.

On the upper surface of the semiconductor substrate (the upper surface of the body layer PB) immediately below the contact plug SC2, a $p^+$-type diffusion region BC that is a body contact region is formed. A depth of the $p^+$-type diffusion region BC is shallower than a depth of the body layer PB. The $p^+$-type diffusion region BC is in contact with the body layer PB. The contact plug SC2 is in contact with the source region SR and the $p^+$-type diffusion region BC. In this manner, the source region SR and the $p^+$-type diffusion region BC are electrically connected to the wiring M1S1 through the contact plug SC2. The body layer PB is electrically connected to the wiring M1S1 through the $p^+$-type diffusion region BC and the contact plug SC2.

As described above, the trench D2 has the double-gate structure including the gate electrode GE and the field plate electrode FP therein. However, in the region 1A surrounded by the dot line in FIG. 1, the gate electrode GE is not formed, and only the field plate electrode FP is formed as the electrode. In the region 1A, the contact plug SC1 for applying the source potential from the wiring M1S1 to the field plate electrode FP is formed on the field plate electrode FP.

In the above-described manner, the source potential is applied to each of the source region SR, the body layer PB, the field plate electrode FP and the conductive film CL, and the gate potential is applied to the gate electrode GE. Each MOSFET of the present embodiment is the intra-trench double-gate power MOSFET, and the field plate electrode to which the source potential is applied is included inside the trench, and therefore, the parasitic capacity of the MOSFET can be suppressed, and the switching speed of the MOSFET can be increased.

Next, the sensing MOSFET 1SM will be explained. However, since the sensing MOSFET 1SM and the main MOSFET 1MM are different in the area but the same in the structure, the detailed explanation for the structure of the sensing MOSFET 1SM is omitted. In FIG. 1, the layout of the sensing MOSFET 1SM is illustrated while the layout of the main MOSFET 1MM is shrunk. However, practically, the sizes such as the width of each of the trench and the contact plug configuring the sensing MOSFET 1SM and the distance between the trenches of each of them are the same as those of the main MOSFET 1MM.

As shown in FIGS. 1 and 3, in the active region of the sensing MOSFET 1SM, a plurality of trenches D4 and one annular trench D3 are formed on the upper surface of the semiconductor substrate as similar to the trenches D2 and D1 of the main MOSFET 1MM. In other words, the gate electrode GE and the field plate electrode FP are formed inside the trench D4, and the conductive film CL is formed inside the trench D3. The trench D3 and the insulating film IF1 and the conductive film CL inside the trench D3 configure the termination ring TR2. The source region SR, the drain region DR, the body layer PB and the gate electrode GE formed in this active region configure the sensing MOSFET 1SM that is the vertical-type MOSFET.

The source region SR and the $p^+$-type diffusion region BC formed inside the body layer PB are electrically connected to a wiring M1S2 on the interlayer insulating film IL through the contact plug SC2. The conductive film CL inside the trench D3 is electrically connected to the wiring M1S2 through the contact plug SC3. The gate electrode GE is electrically connected to the wiring M1G through the contact plug GC.

The trench D4 is a groove having the double-gate structure. Inside the trench D4 of the region 1B illustrated with the broken line in FIG. 1, the field plate electrode FP is formed as similar to the trench D2 of the region 1A while the gate electrode GE is not formed. The contact plug SC1 penetrating the interlayer insulating film IL is formed in the region 1B, and the field plate electrode FP inside the trench D4 is electrically connected to the wiring M1S2 through the contact plug SC1.

FIG. 1 shows a source pad SSP made of a part of the upper surface of the wiring M1S2 in the rectangular opening of the passivation film. The source potential is applied to each of the source region SR, the $p^+$-type diffusion region BC, the body layer PB and the conductive film CL formed in the active region of the sensing MOSFET and the conductive film CL surrounding this active region in plan view through the contact plugs SC1, SC2 and SC3. The trench D2 and the trench D4 extend in the same direction that is the Y direction. The gate potential is applied to the gate electrode GE configuring the sensing MOSFET 1SM through the contact plug GC connected to the gate electrode GE on the end of the trench D4 in the Y direction.

As described above, although the sign used for the explanation of the present embodiment is different, the main MOSFET 1MM and the sensing MOSFET 1SM have the same structure. The gate potential is applied to each of the gate electrode GE of the main MOSFET 1MM and the gate electrode GE of the sensing MOSFET 1SM through the same gate pad GP. On the other hand, the source pad SP for applying the source potential to the source region SR of the main MOSFET 1MM or others and the source pad SSP for applying the source potential to the source region SR of the sensing MOSFET 1SM or others are different from each other. The wiring M1S1 configuring the source pad SP and the wiring M1S2 configuring the source pad SSP separate and are electrically insulated from each other. As shown in the circuit diagram of FIG. 4, the respective drain electrodes of the main MOSFET 1MM and the sensing MOSFET 1SM are connected to each other, and the respective gate electrodes of the same are connected to each other.

One of main features of the semiconductor device of the present embodiment is adoption of a planar layout in which the main MOSFET 1MM and the sensing MOSFET 1SM for the electric-current detection that are the vertical-type MOSFETs each including the double-gate structure are surrounded by the termination rings TR1 and TR2. As described above, since the main element and the sensing element are surrounded by the trenches D1 and D3, respectively, the source region SR of the main MOSFET 1MM and the source region SR of the sensing MOSFET 1SM are electrically insulated from each other to secure the breakdown voltage.

Figure 5:
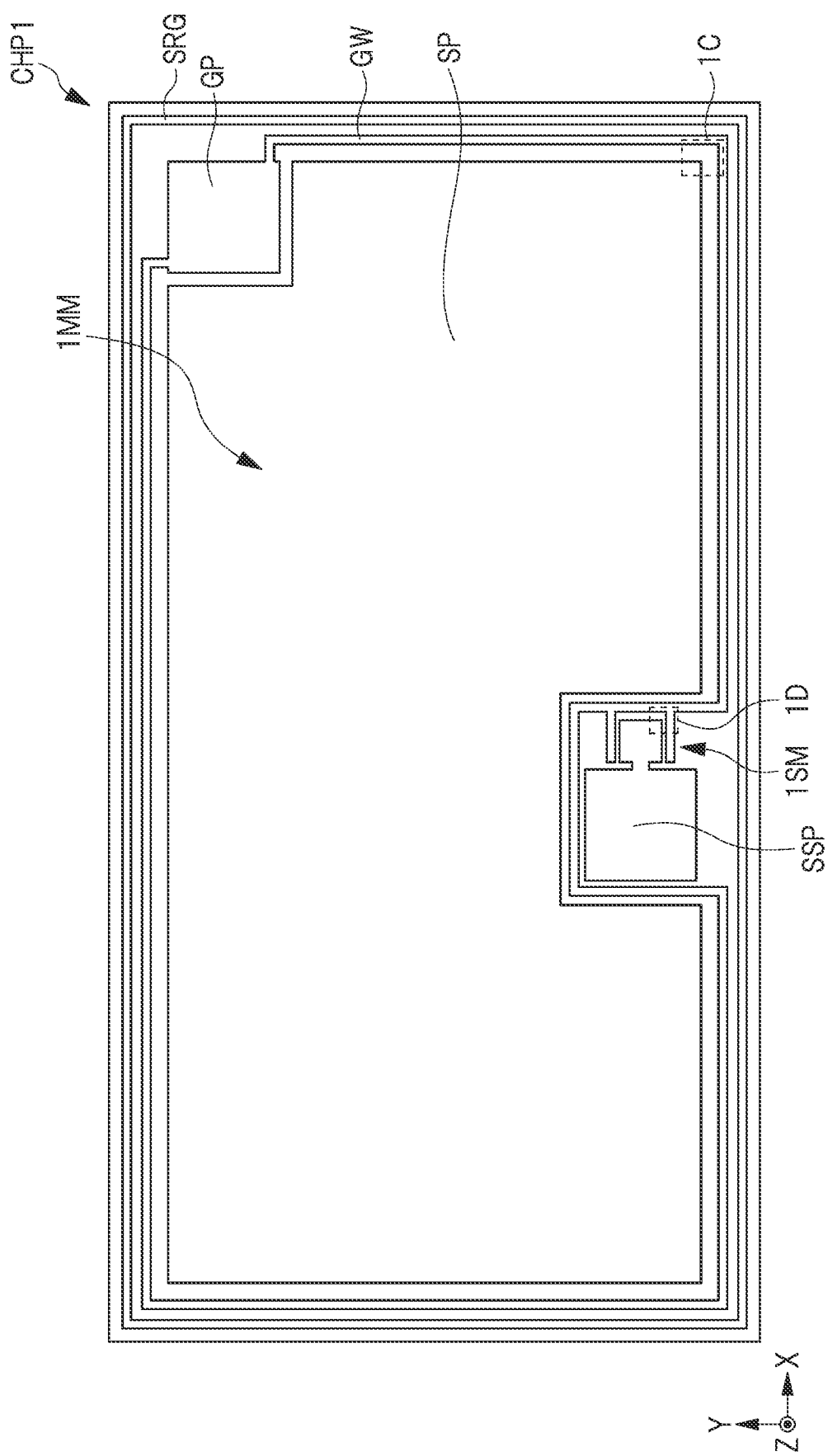
FIG. 5 is a planar layout showing the semiconductor device according to the first embodiment.
Figure 6:
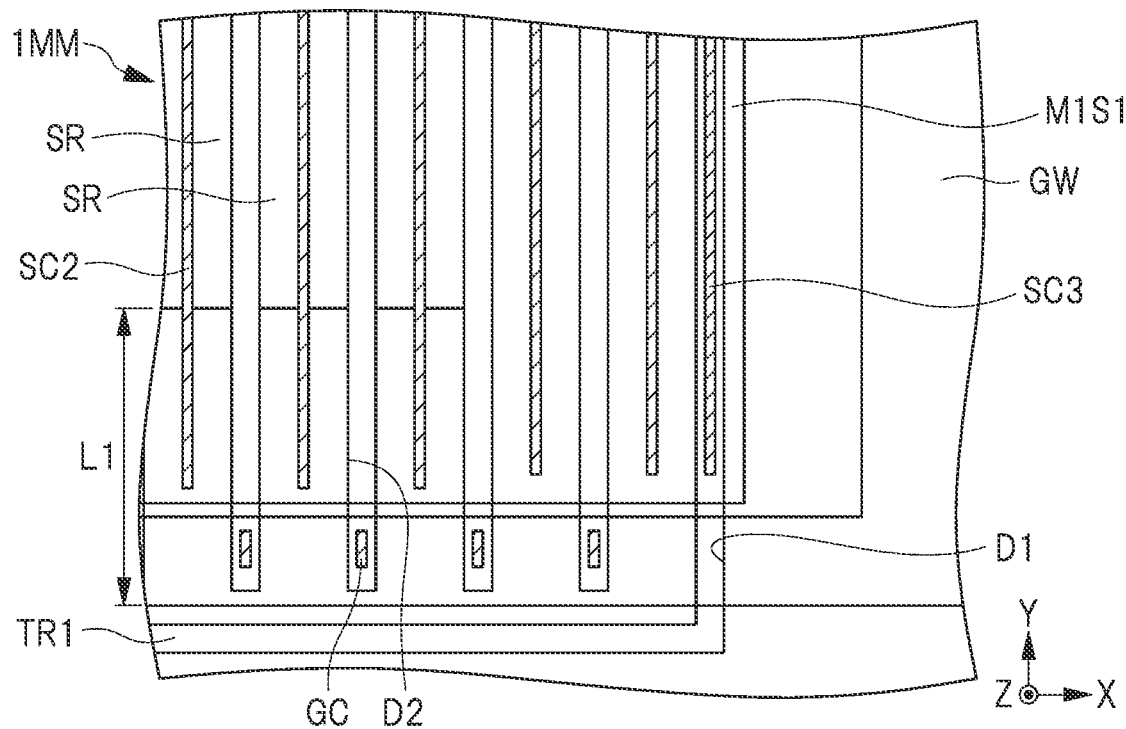
FIG. 6 is a planar layout showing a region 1C of FIG. to be enlarged.
Figure 7:
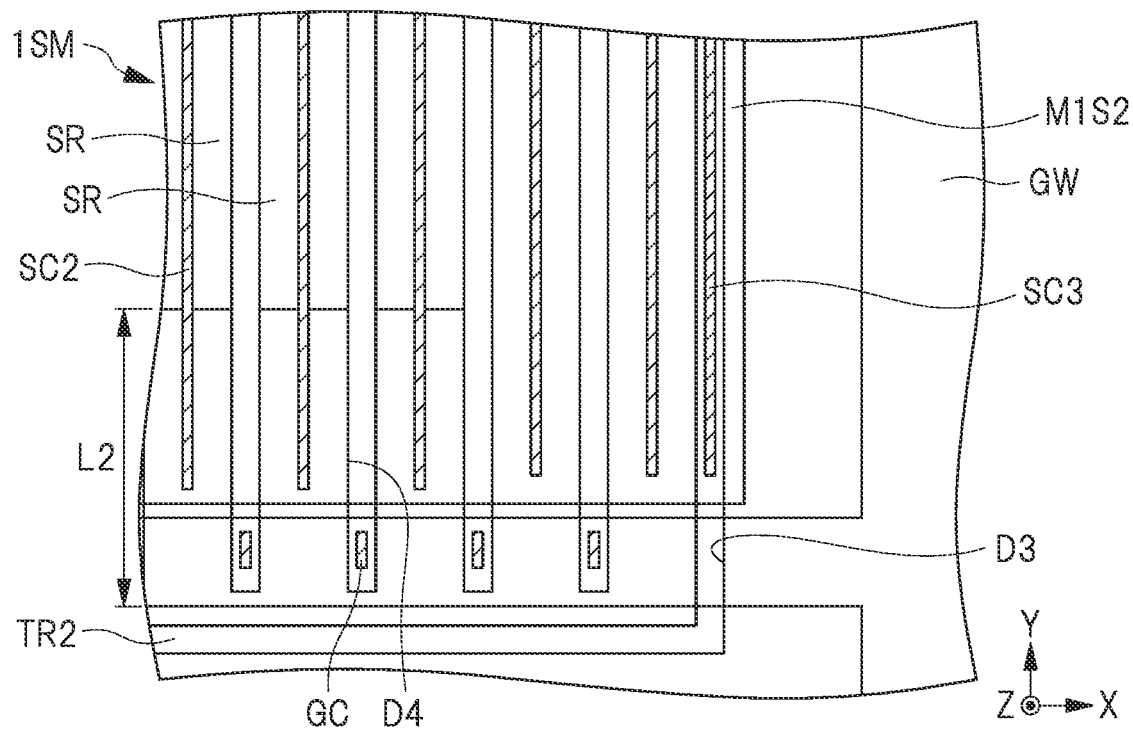
FIG. 7 is a planar layout showing a region 1D of FIG. to be enlarged.

With reference to FIGS. 5, 6 and 7, an example of the planar layout of the semiconductor device of the present embodiment will be explained. FIG. 5 shows the example of the planar layout of the semiconductor chip CHP1. As shown in FIG. 5, in the region close to the upper surface of the semiconductor chip CHP1, the source pad SP (wiring M1S1) occupying most of the area of the upper surface of the semiconductor chip CHP1 is formed. In addition to this, in the region close to the upper surface of the semiconductor chip CHP1, the gate pad GP and the source pad SSP that are smaller than the source pad SP are formed. From the gate pad GP, the gate wiring GW is annularly formed to surround the source pad SP in plan view. While the main MOSFET 1MM is formed immediately below the source pad SP, the sensing MOSFET 1SM is formed in the region adjacent to the source pad SSP. In this region, a part of the gate wiring GW extends to supply the gate potential to the sensing MOSFET.

FIG. 6 shows an enlarged diagram of a region 1C surrounded by a dot line in FIG. 5, in other words, an end of the main MOSFET 1MM. FIG. 7 shows an enlarged diagram of a region 1D surrounded by a dot line in FIG. 5, in other words, an end of the sensing MOSFET.

As shown in FIGS. 6 and 7, both the source region SR of the main MOSFET 1MM and the source region SR of the sensing MOSFET 1SM are formed to separate from the gate wiring GW and the termination rings TR1 and TR2 in plan view. In this case, a distance L1 between the termination ring TR1 and the plurality of source regions SR configuring the main MOSFET 1MM in the Y direction (that is the extension region of the trench D2) is constant at any position. Similarly, a distance L2 between the termination ring TR2 and the plurality of source regions SR configuring the sensing MOSFET 1SM in the Y direction (that is the extension region of the trench D4) is constant at any position. The distance L1 and the distance L2 are equal to each other.

Note that FIGS. 2 and 3 show a structure in which the source region SR is formed on a partial upper surface of the semiconductor substrate adjacent to the trench D2 or D4 adjacent to the trench D1 or D3. On the other hand, as shown in FIGS. 6 and 7, the source region SR may be not formed on the upper surface of the semiconductor substrate adjacent to the trench D2 or D4 adjacent to the trench D1 or D3.

Effect of Present Embodiment

As explained for the rooms for improvement, in the intra-trench double-gate power MOSFET, the threshold voltage Vth is decreased, and the punch-through phenomenon occurs when the main MOSFET and the sensing MOSFET are separated by only the separation of the doping at the time of the formation of the $n^+$-type diffusion region. On the other hand, in the present embodiment, the main MOSFET 1MM and the sensing MOSFET 1SM are surrounded by the termination rings TR1 and TR2, respectively. Therefore, the decrease of the threshold voltage Vth and the occurrence of the punch-through phenomenon as described above can be prevented. Therefore, while the main MOSFET and the sensing MOSFET for electric-current detection are functioned, the breakdown voltage between the mutual elements can be secured.

As different from the comparative example shown in FIG. 13, the layout of the wirings M1S1 and M1S2 (source wiring) and the wiring M1G (gate wiring GW) is the simple routing, and thus, the wiring can be simplified. Also, in the comparative example, the substantially unavailable region is formed in the region 1Y near the contact plug of the active region. However, in the present embodiment, the active region does not interfere the region where the contact plug is formed, and therefore, the unavailable region of the cell is not formed. Therefore, the reduction of the chip size and the maximization of the cell effective area can be expected.

As explained with reference to FIGS. 5 to 7, both the distances of the main MOSFET and the sensing MOSFET from the termination rings TR1 and TR2 surrounding the SR are constant. The certain direction is the extension direction of the gate electrode GE, the trenches D2 and D4 or the source region SR.

As described above, on each outer circumference of the main MOSFET 1MM and the sensing MOSFET 1SM, all the distances from the termination rings TR1 and TR2 to the source region SR ($n^+$-type diffusion region) are set to be equal. If there is an unequal distance portion, a route of flow of an avalanche current is unbalanced to generate heat at this portion, and a problem of reduction of a breakdown voltage amount arises. In the present embodiment, since the distance between the termination rings and the source region is equal among all the regions in the semiconductor chip CHP1, the reduction of the breakdown voltage amount can be prevented, and the breakdown voltage can be secured.

As described above, the present embodiment can solve the first room for improvement and the second room for improvement. In other words, the breakdown voltage can be secured, and the increase of the size of the semiconductor chip can be prevented, and therefore, the performance of the semiconductor device can be improved.

Second Embodiment

Figure 8:
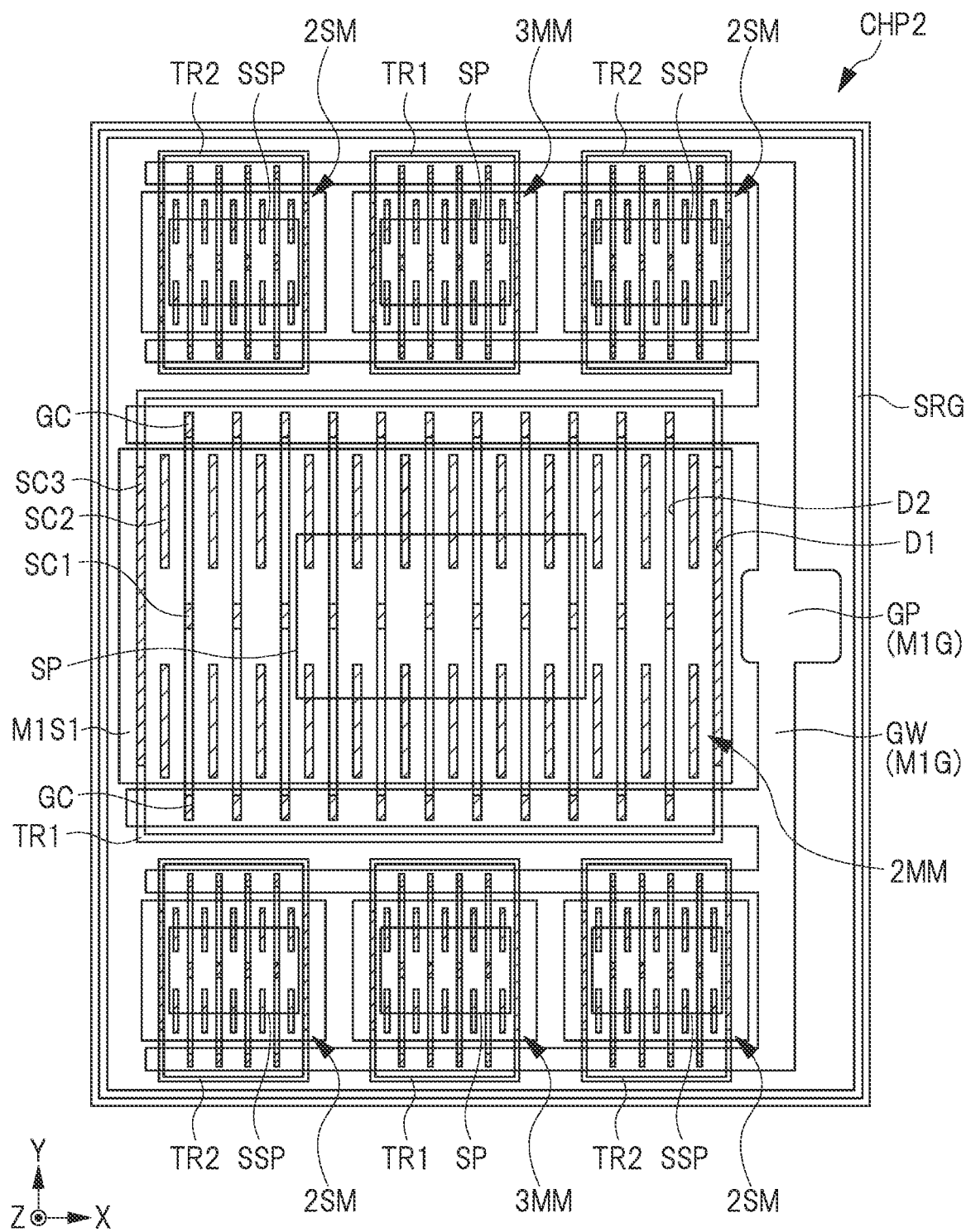
FIG. 8 is a planar layout showing a semiconductor device according to a second embodiment.

With reference to FIG. 8, a semiconductor device of the present embodiment including a plurality of sensing MOSFETs will be explained. FIG. 8 is a planar layout showing the semiconductor device according to the present embodiment.

As shown in FIG. 8, the semiconductor device according to the present embodiment is made of a semiconductor chip CHP2. In the semiconductor device according to the present embodiment, a sensing MOSFET 2SM is arranged at each of four corners of the semiconductor chip CHP2 having a rectangular plan shape, and an electric current that is detected by each of the sensing MOSFETs 2SM is averaged and detected.

In other words, the semiconductor chip CHP2 includes a main MOSFET 2MM that is arranged at a center in plan view and that occupies a larger area than those of other elements. A structure of the main MOSFET 2MM is the same as that of the main MOSFET 1MM explained with reference to FIGS. 1, 2 and others. A plurality of, in other words, three or more elements that are aligned in the X direction are arranged in the Y direction between the main MOSFET 2MM and one side of the rectangular semiconductor chip CHP2. Similarly, a plurality of, in other words, three or more elements that are aligned in the X direction are arranged in the Y direction between the main MOSFET 2MM and one side opposite to the one side of the rectangular semiconductor chip CHP2. Both-end elements of the plurality of, in other words, three or more elements that are aligned in the X direction are the sensing MOSFETs 2SM, and other element (element except for the both-end elements) is a main MOSFET 3MM.

In other words, the sensing MOSFET 2SM is formed at each of the four corners of the rectangular semiconductor chip CHP2 in plan view. Each of the sensing MOSFET 2SM and the main MOSFET 3MM is smaller in the area than the main MOSFET 2MM, but the same in the structure as that of the main MOSFET 2MM. In FIG. 8, the main MOSFET 3MM and the sensing MOSFET 2SM are illustrated to be of the same size as each other. However, the main MOSFET 3MM may be larger than the sensing MOSFET 2SM. Gate electrodes of the main MOSFETs 2MM and 3MM are connected to each other, and drain electrodes of the same are connected to each other. The main MOSFET 3MM is used for the same purpose as that of the main MOSFET 2MM. In other words, the main MOSFETs 2MM and 3MM are connected to each other at the time of assembly to function as one large main MOSFET.

In this case, in plan view, the active region of the main MOSFET 2MM is surrounded by one termination ring TR1, and the active region of the main MOSFET 3MM is surrounded by a different termination ring TR1. In plan view, the active region of the sensing MOSFET 2SM is surrounded by one termination ring TR2.

The semiconductor chip easily generates the heat particularly at the center when the electric current flows therein, and the temperature varies at an end of the chip. Therefore, when the heat generation of the semiconductor chip is detected by the sensing MOSFET for electric-current detection, the sensing MOSFET is preferably arranged at the center of the semiconductor chip. However, it is practically difficult to achieve such arrangement in some cases because of packaging limitation or others.

Accordingly, in the semiconductor device of the present embodiment, the sensing MOSFET 2SM is formed at each of four corners of the semiconductor chip CHP2. In this manner, the electric current can be detected at four positions of the semiconductor chip CHP2. And, since the electric current detected by the sensing MOSFETs 2SM at these four positions is averaged and detected (calculated), the electric-current detection with high accuracy is achieved.

Third Embodiment

Figure 9:
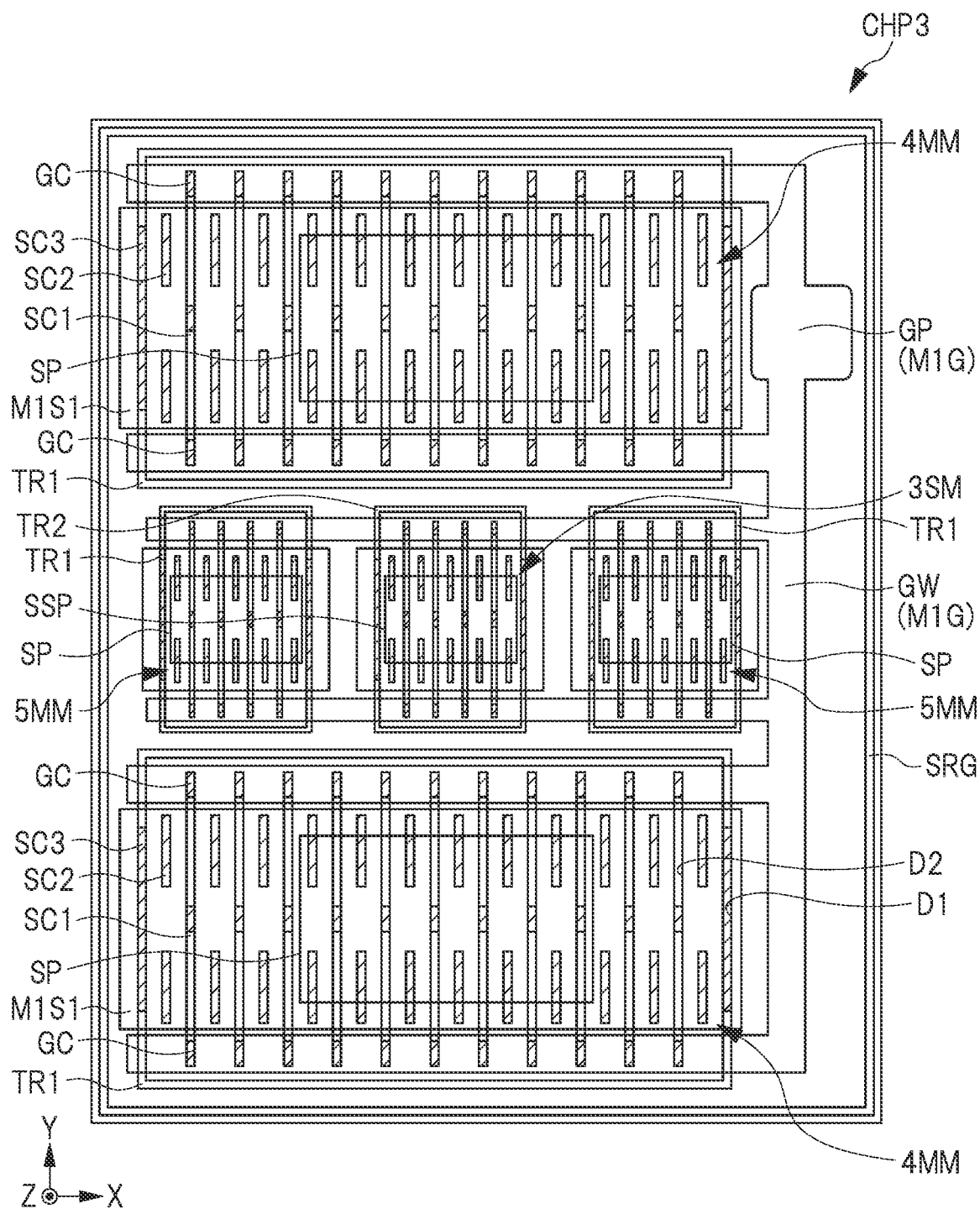
FIG. 9 is a planar layout showing a semiconductor device according to a third embodiment.

With reference to FIG. 9, a semiconductor device of the present embodiment including the sensing MOSFET at a center of the chip will be explained. FIG. 9 is a planar layout showing the semiconductor device of the present embodiment.

As shown in FIG. 9, the semiconductor device of the present embodiment is made of a semiconductor chip CHP3. The semiconductor device of the present embodiment includes two main MOSFETs 4MM that are aligned in the Y direction, and a plurality of, in other words, three or more elements that are aligned in the X direction are arranged between these main MOSFETs 4MM. Both-end elements of the plurality of, in other words, three or more elements that are aligned in the X direction are the main MOSFETs 5MM, and an element between these main MOSFETs 5MM on both ends is a sensing MOSFET 3SM. In this case, the sensing MOSFET 3SM is arranged at a center of the rectangular semiconductor chip CHP3 in plan view.

A structure of the main MOSFET 4MM is the same as that of the main MOSFET 2MM explained with reference to FIG. 8. A structure of the main MOSFET 5MM is the same as that of the main MOSFET 3MM explained with reference to FIG. 8. A structure of the sensing MOSFET 3SM is the same as that of the sensing MOSFET 2SM explained with reference to FIG. 8. The main MOSFETs 4MM and 5MM are connected to each other at the time of assembly to function as one large main MOSFET.

As explained in the second embodiment, when the heat generation of the semiconductor chip is detected by the sensing MOSFET for electric-current detection, the sensing MOSFET is preferably arranged at the center of the semiconductor chip. Accordingly, in the semiconductor device of the present embodiment, the sensing MOSFET 3SM is formed at the center of the semiconductor chip CHP3 in plan view. In this manner, the electric current can be detected at a higher accuracy than that in the case of the arrangement of the sensing MOSFET at the end of the semiconductor chip.

Fourth Embodiment

Figure 10:
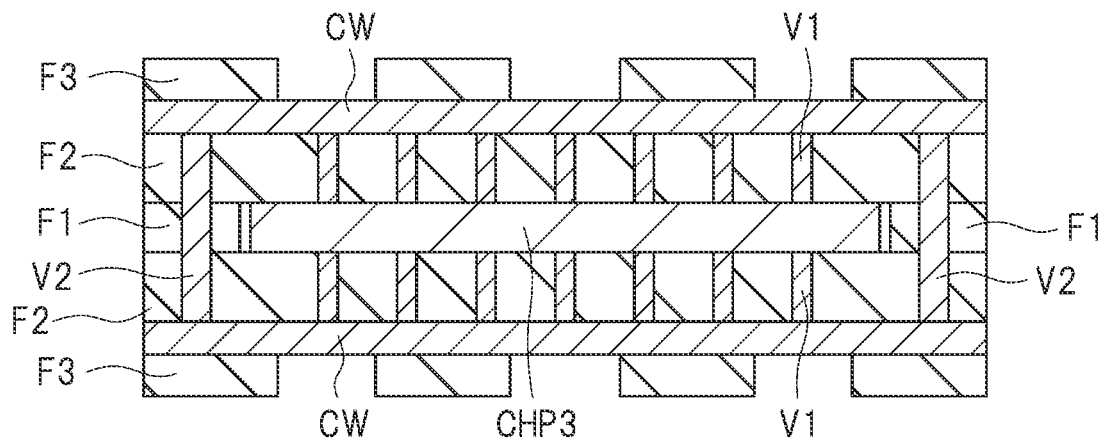
FIG. 10 is a schematic cross-sectional view showing a semiconductor device according to a fourth embodiment.
Figure 11:
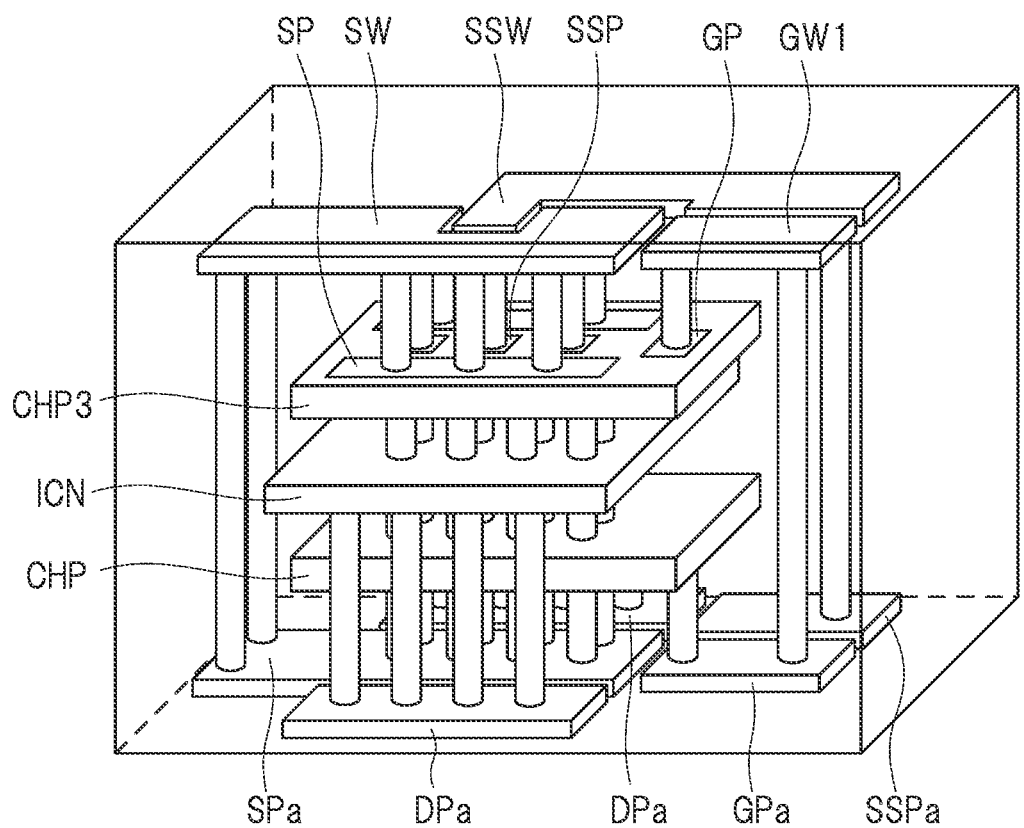
FIG. 11 is a perspective view showing the semiconductor device according to the fourth embodiment.
Figure 12:
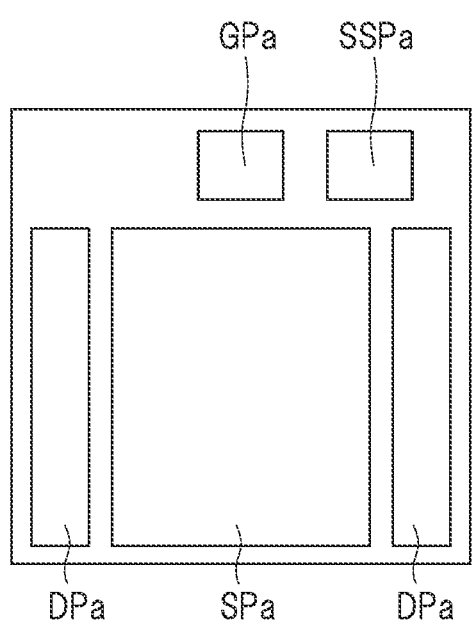
FIG. 12 is a view showing a lower surface of the semiconductor device according to the fourth embodiment.

With reference to FIGS. 10 to 12, a package in which each semiconductor chip of the first to third embodiments is connectable by a simple wiring will be explained. FIG. is a schematic cross-sectional view showing a package that is a semiconductor device according to the present embodiment. FIG. 11 is a perspective view showing a part of the package that is the semiconductor device according to the present embodiment to be transparent. FIG. 12 is a layout showing a lower surface of the package shown in FIG. 11.

The number of pads on the surface of each of the semiconductor chips of the second and third embodiments of the first to third embodiments is particularly large, and therefore, packaging using a publicly-known bonding wire, clip or others complicates the wiring, and causes problems that are the increase of the package size and the complication of the assembly step. Accordingly, packaging using a buried substrate will be explained below.

As shown in FIG. 10, the package of the present embodiment includes, for example, the semiconductor chip CHP3 explained in the third embodiment. Upper and lower portions of the semiconductor chip CHP3 are sandwiched together with an adjacently-arranged substrate F1 by a substrate F2. A plurality of substrates F3 are bonded to a lower surface of the substrate F2 below the semiconductor chip CHP3 so as to interpose a conductive layer CW therebetween. Similarly, a plurality of substrates F3 are bonded to an upper surface of the substrate F2 above the semiconductor chip CHP3 so as to interpose a different conductive layer CW therebetween. Each of the substrates F1 to F3 is mainly made of an insulator, and is a printed board (such as a FR4 substrate) having a surface on which a wiring is printed. The conductive layer CW is made of, for example, copper (Cu).

In the substrate F2, a via V1 made of, for example, Cu is buried inside each of a plurality of through holes that are formed in an up-and-down direction. The conductive layer CW, the source electrode, the gate electrode or the drain electrode on the surface of the semiconductor chip CHP3 is electrically connected to the conductive layer CW through the via V1. Note that it is needless to say that the source electrode, the gate electrode and the drain electrode are electrically connected to the different conductive layers CW that are electrically insulated from each other.

The conductive layer CW below the semiconductor chip CHP3 and the conductive layer CW above the semiconductor chip CHP3 are electrically connected to each other by a via V2 penetrating a layered substrate made of the substrate F1 and the substrate F2 above and below the substrate F1. Note that the via V2 is for drawing a wiring connected to each of the source electrode, the gate electrode and the drain electrode, and is not for connecting the source electrode or the gate electrode and the drain electrode. The via V2 is made of, for example, Cu. As described above, the package of the present embodiment is a package having a structure in which the semiconductor chip CHP3 is buried inside the layered substrates F1 to F3, that is a buried substrate structure.

Next, as another example of the package of the present embodiment, a structure of a package including a plurality of semiconductor chips will be explained with reference to FIGS. 11 and 12. The package shown in FIGS. 11 and 12 is a package having the same buried substrate structure as the structure explained with reference to FIG. 10. In FIG. 11, the semiconductor chip and the wiring are illustrated while a substrate (buried substrate) except for the semiconductor chip is transparently illustrated.

The package shown in FIG. 11 includes the semiconductor chip CHP3 and the semiconductor chip CHP below it therein. The semiconductor chip CHP will be explained as a chip including, for example, not the sensing MOSFET but only the main MOSFET. However, as explained in the first to third embodiments, this may include the sensing MOSFET. The semiconductor chip CHP3 and the semiconductor chip CHP are arranged so that these drain electrodes face each other. An intermediate conductor ICN is arranged between the semiconductor chip CHP3 and the semiconductor chip CHP, and each of the drain electrode of the semiconductor chip CHP3 and the drain electrode of the semiconductor chip CHP is electrically connected to the intermediate conductor ICN through a via.

As shown in FIGS. 11 and 12, a gate pad GPa, a source pad Spa, a drain pad DPa and a source pad SSPa each made of a conductor are exposed out of a lower surface of the package. Each drain electrode of the semiconductor chips CHP and CHP3 is electrically connected to the drain pad DPa through a via and the intermediate conductor ICN. The gate pad of the semiconductor chip CHP is electrically connected to the gate pad GPa through a via. The source pad of the semiconductor chip CHP is electrically connected to the source pad SPa through a via.

On the semiconductor chip CHP3 in the package, a source wiring SW, a gate wiring GW1 and a sensing source wiring SSW that are conductor plates are arranged. The gate pad GP of the semiconductor chip CHP3 is electrically connected to the gate pad GPa through a via and the gate wiring GW1. The source pad SP of the semiconductor chip CHP3 is electrically connected to the source pad SPa through a via and the source wiring SW. The source pad SSP of the semiconductor chip CHP3 is electrically connected to the source pad SSPa through a via and the sensing source wiring SSW.

As described above, the semiconductor chip explained in the first to third embodiments is allowed to be buried inside the package based on the buried substrate structure. The number of pads of the main MOSFET and the sensing MOSFET on the upper surface of the semiconductor chip explained in each of the second and third embodiment is particularly large. However, in the case of the buried substrate package, assembly is achieved by the simple wiring.

In the present embodiment, the wiring to be connected to the pad (electrode) of the semiconductor chip is achieved by neither the wire nor the clip but the via. When one semiconductor chip is embedded as shown in FIG. 10, the adoption of the buried substrate package reduces a thickness of the package to be about 0.4 mm. In not only the case of one semiconductor chip but also the case of the plurality of semiconductor chips as shown in FIGS. 11 and 12, a degree of freedom of the wiring routing can be increased while the package is maintained to be thin. Also, by the increase of the number of vias, a package resistance can be also reduced. By the parallel connection of the semiconductor chips inside the package in the vertical direction, an ON resistance of a product can be reduced without increase of a mounting area.

In the foregoing, the invention made by the present inventors has been concretely described on the basis of the embodiments. However, it is needless to say that the present invention is not limited to the foregoing embodiments, and various modifications can be made within the scope of the present invention.

What is claimed is:

1. A semiconductor device including a first semiconductor chip including a first field effect transistor and a second field effect transistor for electric-current detection, comprising:

a semiconductor substrate including a first main surface and a second main surface opposite to the first main surface, and including a first region and a second region separated from each other in plan view;

a first trench, a second trench, a third trench and a fourth trench, each of which is formed in the first main surface of the semiconductor substrate and reaches a depth in middle of the semiconductor substrate;

a first source region of a first conductive type formed in a portion inside the semiconductor substrate, the portion including the first main surface of the semiconductor substrate, between a plurality of the second trenches extending in a first direction along the first main surface of the semiconductor substrate and being aligned in a second direction being along the first main surface of the semiconductor substrate and crossing the first direction;

a first semiconductor region of a second conductive type formed inside the semiconductor substrate to be in contact with the first source region and the second trench, the second conductive type being different from the first conductive type;

a second source region of the first conductive type formed in a portion inside the semiconductor substrate, the portion including the first main surface of the semiconductor substrate, between a plurality of the fourth trenches extending in a third direction along the first main surface of the semiconductor substrate and being aligned in a fourth direction being along the first main surface of the semiconductor substrate and crossing the third direction;

a second semiconductor region of the second conductive type formed inside the semiconductor substrate to be in contact with the second source region and the fourth trench;

a drain region of the first conductive type formed in a portion inside the semiconductor substrate, the portion including the second main surface of the semiconductor substrate;

a first gate electrode and a first electrode formed inside the second trench to interpose a first insulating film therebetween and being electrically insulated from each other;

a second gate electrode and a second electrode formed inside the fourth trench to interpose a second insulating film therebetween and being electrically insulated from each other;

a third insulating film formed inside each of the first trench and the third trench; and a first wiring, a second wiring and a third wiring formed on the semiconductor substrate to interpose an interlayer insulating film therebetween, wherein the first gate electrode, the first source region, the first semiconductor region and the drain region formed inside the second trench in the first region configure the first field effect transistor, wherein the second gate electrode, the second source region, the second semiconductor region and the drain region formed inside the fourth trench in the second region configure the second field effect transistor, wherein the first wiring is electrically connected to the first source region and the first electrode, wherein the second wiring is electrically connected to the second source region and the second electrode, wherein the third wiring is electrically connected to the first gate electrode and the second gate electrode, wherein the first trench surrounds the first region in plan view, and wherein the second trench surrounds the second region in plan view.

2. The semiconductor device according to claim 1,
wherein a distance between the first source region and the second trench in the first direction and a distance between the second source region and the fourth trench in the third direction are constant.

3. The semiconductor device according to claim 1 further comprising
a plurality of the second regions,
wherein each of the plurality of the second regions includes the second field effect transistor.

4. The semiconductor device according to claim 3,
wherein electric currents detected by the plurality of the second field effect transistors, respectively, are averaged and detected.

5. The semiconductor device according to claim 3,
wherein the plurality of the second field effect transistors are arranged at four corners of the first semiconductor chip having a rectangular plan shape, respectively.

6. The semiconductor device according to claim 1,
wherein, in plan view, the second field effect transistor is arranged at a center of the first semiconductor chip.

7. The semiconductor device according to claim 1,
wherein the first semiconductor chip is embedded inside a buried substrate package.

8. The semiconductor device according to claim 1,
wherein the first semiconductor chip and a second semiconductor chip that is different from the first semiconductor chip are included inside the buried substrate package.

\* \* \* \* \*